(12) United States Patent
Hwang et al.

(10) Patent No.: US 10,969,686 B2
(45) Date of Patent: Apr. 6, 2021

(54) FILM MASK, METHOD FOR MANUFACTURING SAME, AND METHOD FOR FORMING PATTERN USING FILM MASK AND PATTERN FORMED THEREBY

(71) Applicant: LG CHEM, LTD., Seoul (KR)

(72) Inventors: Ji Young Hwang, Daejeon (KR); Han Min Seo, Daejeon (KR); Sangcholl Han, Deajeon (KR); Seung Heon Lee, Daejeon (KR); Dong Hyun Oh, Daejeon (KR); Dae Han Seo, Daejeon (KR); Nam Seok Bae, Daejeon (KR); Min Soo Song, Daejeon (KR)

(73) Assignee: LG CHEM, LTD., Seoul (KR)

( * ) Notice: Subject to any disclaimer, the term of this patent is extended or adjusted under 35 U.S.C. 154(b) by 226 days.

(21) Appl. No.: 15/776,748

(22) PCT Filed: Jan. 31, 2017

(86) PCT No.: PCT/KR2017/001033
§ 371 (c)(1),
(2) Date: May 16, 2018

(87) PCT Pub. No.: WO2017/131499
PCT Pub. Date: Aug. 3, 2017

(65) Prior Publication Data
US 2018/0341176 A1 Nov. 29, 2018

(30) Foreign Application Priority Data
Jan. 27, 2016 (KR) .................. 10-2016-0010237

(51) Int. Cl.
*G03F 7/20* (2006.01)
*G03F 7/00* (2006.01)
(Continued)

(52) U.S. Cl.
CPC .................. *G03F 7/20* (2013.01); *G03F 1/54* (2013.01); *G03F 1/58* (2013.01); *G03F 7/0002* (2013.01);
(Continued)

(58) Field of Classification Search
CPC ..... G03F 1/48; G03F 1/38; G03F 1/76; G03F 1/54; G03F 1/56; G03F 1/50; G03F 1/58;
(Continued)

(56) References Cited

U.S. PATENT DOCUMENTS 4,166,148 A 8/1979 Sakurai
4,752,498 A 6/1988 Fudim
(Continued)

FOREIGN PATENT DOCUMENTS

CN 1595294 3/2005
CN 104937697 9/2015
(Continued)

OTHER PUBLICATIONS

Machine transation of JP 2009-092840 (2009).*
(Continued)

*Primary Examiner* — Martin J Angebranndt
(74) *Attorney, Agent, or Firm* — Dentons US LLP

(57) ABSTRACT

The present application relates to a film mask comprising: a transparent substrate; a darkened light-shielding pattern layer provided on the transparent substrate; and groove portions provided in a region where the darkened light-shielding pattern layer is not provided, a method for manufacturing the same, a method for forming a pattern by using the same, and a pattern manufactured by using the same.

11 Claims, 16 Drawing Sheets

(51) Int. Cl.
  *G03F 1/58* (2012.01)
  *G03F 1/54* (2012.01)
  *H01L 21/033* (2006.01)

(52) U.S. Cl.
  CPC .......... *G03F 7/0007* (2013.01); *G03F 7/0017* (2013.01); *G03F 7/0037* (2013.01); *G03F 7/703* (2013.01); *H01L 21/033* (2013.01); *H01L 21/0332* (2013.01); *H01L 21/0337* (2013.01)

(58) Field of Classification Search
  CPC ...... G03F 7/0002; G03F 7/20; G03F 7/70791; G03F 7/30; G03F 7/0007; G03F 7/7035; G03F 7/703; G03F 7/2014; G03F 21/033; G03F 21/0332; G03F 21/0337; G03F 7/0017; G03F 7/0037; G03F 7/2012
  See application file for complete search history.

(56) References Cited

U.S. PATENT DOCUMENTS

| | | | |
|---|---|---|---|
| 5,079,113 A * | 1/1992 | Ohta | G03F 1/48 430/31 |
| 5,318,868 A | 6/1994 | Hasegawa et al. | |
| 5,718,991 A | 2/1998 | Lin et al. | |
| 5,888,674 A | 3/1999 | Yang et al. | |
| 6,030,729 A * | 2/2000 | Ito | G03F 1/26 430/5 |
| 7,604,906 B1 | 10/2009 | Volk et al. | |
| 7,955,545 B2 | 6/2011 | Lee et al. | |
| 8,177,991 B2 | 5/2012 | Lussem et al. | |
| 8,894,871 B2 | 11/2014 | Shin et al. | |
| 2001/0031426 A1 | 10/2001 | Mancini et al. | |
| 2001/0035821 A1 | 11/2001 | Ruhrig et al. | |
| 2002/0036460 A1 * | 3/2002 | Takenaka | H01J 29/028 313/495 |
| 2002/0182515 A1 | 12/2002 | Hung | |
| 2003/0091908 A1 | 5/2003 | Takayanagi | |
| 2003/0138704 A1 * | 7/2003 | Mei | B82Y 40/00 430/5 |
| 2003/0175154 A1 | 9/2003 | Hsu et al. | |
| 2003/0175427 A1 | 9/2003 | Loo et al. | |
| 2003/0232179 A1 * | 12/2003 | Steenblik | G07D 7/206 428/195.1 |
| 2004/0023162 A1 * | 2/2004 | Hasegawa | G03F 7/0002 430/320 |
| 2004/0123895 A1 * | 7/2004 | Kardauskas | H01L 31/0547 136/244 |
| 2005/0042553 A1 | 2/2005 | Lu et al. | |
| 2005/0170621 A1 | 8/2005 | Kim et al. | |
| 2005/0227497 A1 * | 10/2005 | Padovani | B82Y 10/00 438/758 |
| 2005/0250276 A1 | 11/2005 | Heath et al. | |
| 2006/0056024 A1 | 3/2006 | Ahn et al. | |
| 2006/0113279 A1 | 6/2006 | Little | |
| 2006/0118514 A1 | 6/2006 | Little et al. | |
| 2006/0267029 A1 | 11/2006 | Li | |
| 2007/0183035 A1 | 8/2007 | Asakawa et al. | |
| 2007/0264481 A1 | 11/2007 | DeSimone et al. | |
| 2008/0041816 A1 | 2/2008 | Choo | |
| 2008/0107973 A1 | 5/2008 | Hattori | |
| 2008/0241491 A1 | 10/2008 | Wessels et al. | |
| 2008/0266502 A1 | 10/2008 | Chiu et al. | |
| 2009/0162799 A1 | 6/2009 | Porque | |
| 2009/0219617 A1 | 9/2009 | Asakawa et al. | |
| 2010/0080914 A1 | 4/2010 | Forrest et al. | |
| 2010/0320742 A1 | 12/2010 | Hoffmuller et al. | |
| 2012/0015288 A1 | 1/2012 | Ikeda et al. | |
| 2012/0021139 A1 | 1/2012 | Chang et al. | |
| 2012/0295435 A1 * | 11/2012 | Yoneda | G03F 1/50 438/643 |
| 2013/0167355 A1 | 7/2013 | Lutz et al. | |
| 2013/0270223 A1 | 10/2013 | Lee et al. | |
| 2013/0314685 A1 | 11/2013 | Shin | |
| 2015/0010766 A1 | 1/2015 | Hwang et al. | |
| 2015/0064628 A1 | 3/2015 | Guo | |
| 2015/0118603 A1 | 4/2015 | Hong et al. | |
| 2015/0309417 A1 | 10/2015 | Park et al. | |
| 2015/0367453 A1 | 12/2015 | Herzog | |
| 2015/0368453 A1 | 12/2015 | Wada et al. | |
| 2015/0378252 A1 | 12/2015 | Lee et al. | |
| 2017/0075051 A1 | 3/2017 | Jeong et al. | |
| 2017/0133639 A1 | 5/2017 | Yu | |
| 2017/0157836 A1 | 6/2017 | Miyazawa | |
| 2018/0329286 A1 * | 11/2018 | Hwang | G03F 7/20 |
| 2018/0341176 A1 | 11/2018 | Hwang et al. | |
| 2018/0348627 A1 * | 12/2018 | Hwang | G03F 7/0002 |

FOREIGN PATENT DOCUMENTS

| | | | |
|---|---|---|---|
| CN | 105118844 | 12/2015 | |
| DE | 10-2007-049315 | 4/2009 | |
| EP | 3410214 | 12/2018 | |
| JP | S50-57425 | 5/1975 | |
| JP | S53-23277 | 3/1978 | |
| JP | S53-68578 | 6/1978 | |
| JP | S53-123467 | 10/1978 | |
| JP | 54-071987 | * 6/1979 | |
| JP | S54-141573 | 11/1979 | |
| JP | S53-64343 | 6/1981 | |
| JP | S57-46243 | 3/1982 | |
| JP | S57-124436 | 8/1982 | |
| JP | S58-58546 | 4/1983 | |
| JP | 59-084245 | * 5/1984 | ............... G03F 1/00 |
| JP | S59-143157 | 8/1984 | |
| JP | S60-43660 | 3/1985 | |
| JP | S60-240737 | 11/1985 | |
| JP | S61-196245 | 8/1986 | |
| JP | S62-35361 | 2/1987 | |
| JP | S62-40458 | 2/1987 | |
| JP | S62-67546 | 3/1987 | |
| JP | S62-85251 | 4/1987 | |
| JP | 01-166046 | * 6/1989 | |
| JP | H01-171528 | 7/1989 | |
| JP | H01-241120 | 9/1989 | |
| JP | 02-093537 | * 4/1990 | ............... G03F 1/14 |
| JP | 03-020733 | * 1/1991 | ............... G03F 1/08 |
| JP | H03-129346 | 6/1991 | |
| JP | H04-93948 | 3/1992 | |
| JP | H04-269749 | 9/1992 | |
| JP | H04-294193 | 10/1992 | |
| JP | H04-298382 | 10/1992 | |
| JP | H05-34896 | 2/1993 | |
| JP | H05-200757 | 8/1993 | |
| JP | H05-265196 | 10/1993 | |
| JP | H06-120124 | 4/1994 | |
| JP | 06-250378 | * 9/1994 | ............... G03F 1/08 |
| JP | H07-174911 | 7/1995 | |
| JP | H08-21746 | 1/1996 | |
| JP | H08-99359 | 4/1996 | |
| JP | 10-051183 | * 2/1998 | ............... H05K 9/00 |
| JP | H10-51082 | 2/1998 | |
| JP | 2002-062638 | * 2/2002 | ............... G03F 1/08 |
| JP | 2003-107677 | 4/2003 | |
| JP | 2003-195472 | * 7/2003 | ............... G03F 1/08 |
| JP | 2003-279949 | * 10/2003 | ............... G02B 3/00 |
| JP | 2003-295428 | 10/2003 | |
| JP | 2004-304097 | 10/2004 | |
| JP | 2005-056981 | 3/2005 | |
| JP | 2005-062545 | 3/2005 | |
| JP | 2005-215624 | * 8/2005 | ............... G02B 3/00 |
| JP | 2006-011211 | * 1/2006 | ............... G02B 6/13 |
| JP | 2006-084776 | 3/2006 | |
| JP | 2006-324369 | 11/2006 | |
| JP | 2006-327182 | * 12/2006 | ............... G02B 3/00 |
| JP | 2007-103915 | * 4/2007 | |
| JP | 2007-128083 | * 5/2007 | ........... G03F 7/2014 |
| JP | 2007-150053 | 6/2007 | |
| JP | 2007-165679 | 6/2007 | |
| JP | 2008-046580 | 2/2008 | |
| JP | 2008-074043 | 4/2008 | |
| JP | 2008-090238 | 4/2008 | |

(56) References Cited

FOREIGN PATENT DOCUMENTS

| | | | | |
|---|---|---|---|---|
| JP | 2008-522226 | | 6/2008 | |
| JP | 2008-241987 | | 10/2008 | |
| JP | 2008-242293 | | 10/2008 | |
| JP | 2008-299178 | | 12/2008 | |
| JP | 2008-311416 | * | 12/2008 | ............... G03F 9/00 |
| JP | 2009-092840 | * | 4/2009 | ............... G03F 1/14 |
| JP | 2009-093084 | * | 4/2009 | ............... G03F 1/08 |
| JP | 2009-105252 | | 5/2009 | |
| JP | 2009-145742 | | 7/2009 | |
| JP | 2009-188237 | * | 8/2009 | ............ H01L 33/00 |
| JP | 2010060681 | | 3/2010 | |
| JP | 2010-158805 | * | 7/2010 | ........... H01L 21/027 |
| JP | 2010-237542 | | 10/2010 | |
| JP | 2011-028174 | | 2/2011 | |
| JP | 2011-029248 | * | 2/2011 | ........... H01L 21/027 |
| JP | 2011-062879 | * | 3/2011 | ............... G02B 3/00 |
| JP | 2011-133750 | | 7/2011 | |
| JP | 2011-183731 | | 9/2011 | |
| JP | 2011-242473 | | 12/2011 | |
| JP | 2012-101474 | | 5/2012 | |
| JP | 2012-108352 | | 6/2012 | |
| JP | 2014-096593 | | 5/2014 | |
| JP | 2015-507214 | | 3/2015 | |
| JP | 2015-079100 | | 4/2015 | |
| JP | 2015-159179 | | 9/2015 | |
| JP | 2018-535446 | | 11/2018 | |
| JP | 2018-536184 | | 12/2018 | |
| JP | 2019-502143 | | 1/2019 | |
| KR | 10-0271699 | | 12/2000 | |
| KR | 10-2005-0038243 | | 4/2005 | |
| KR | 10-2007-0027083 | | 3/2007 | |
| KR | 10-2009-0003601 | | 1/2009 | |
| KR | 10-2009-0019200 | | 2/2009 | |
| KR | 10-2010-0074434 | | 7/2010 | |
| KR | 10-2011-0107120 | | 9/2011 | |
| KR | 10-2012-0019241 | | 3/2012 | |
| KR | 10-2013-0061657 | | 6/2013 | |
| KR | 10-2013-0091225 | | 8/2013 | |
| KR | 10-2013-0116978 | | 10/2013 | |
| KR | 10-2013-0126391 | | 11/2013 | |
| KR | 10-2015-0004647 | | 1/2015 | |
| WO | 2016-006592 | | 1/2016 | |
| WO | 2014/104074 | | 1/2017 | |

OTHER PUBLICATIONS

Kim et al., "Nanolithography based on patterned metal transfer and its application to organic electronic devices," Applied Physics Letters, 80(21): 4051-4053, published May 27, 2002.

* cited by examiner

[Figure 1]
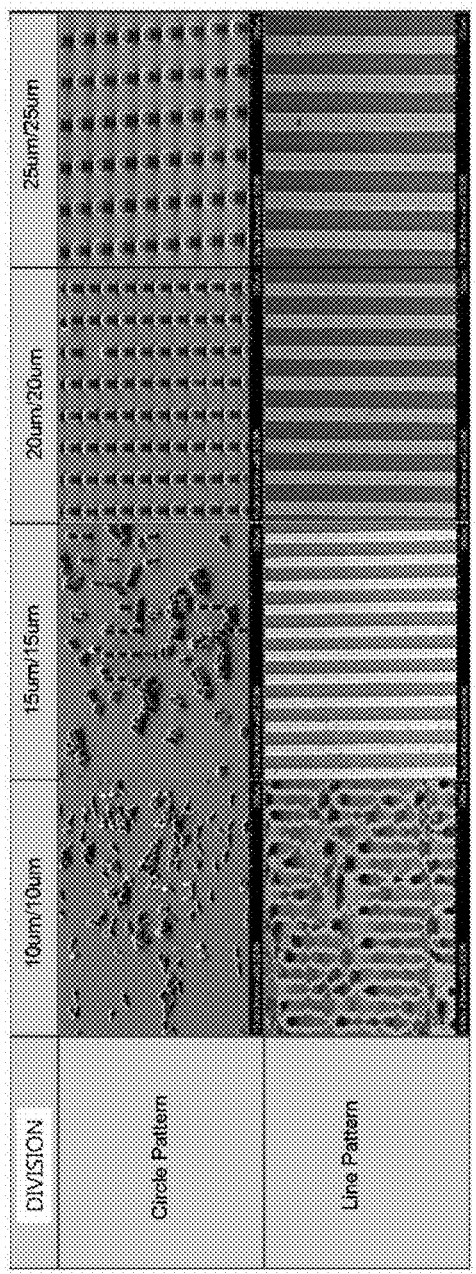

[Figure 2]
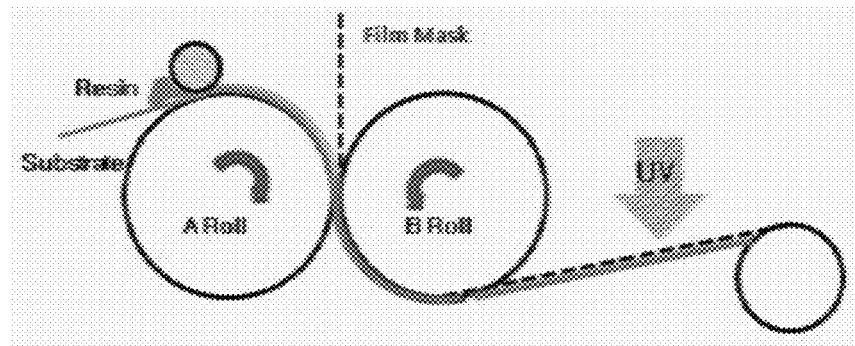
[Figure 3]
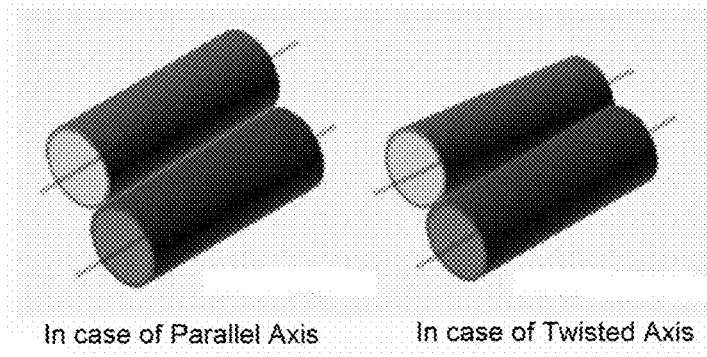
[Figure 4]
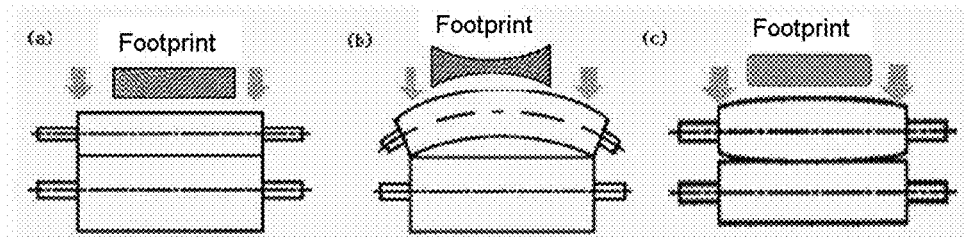

[Figure 5]
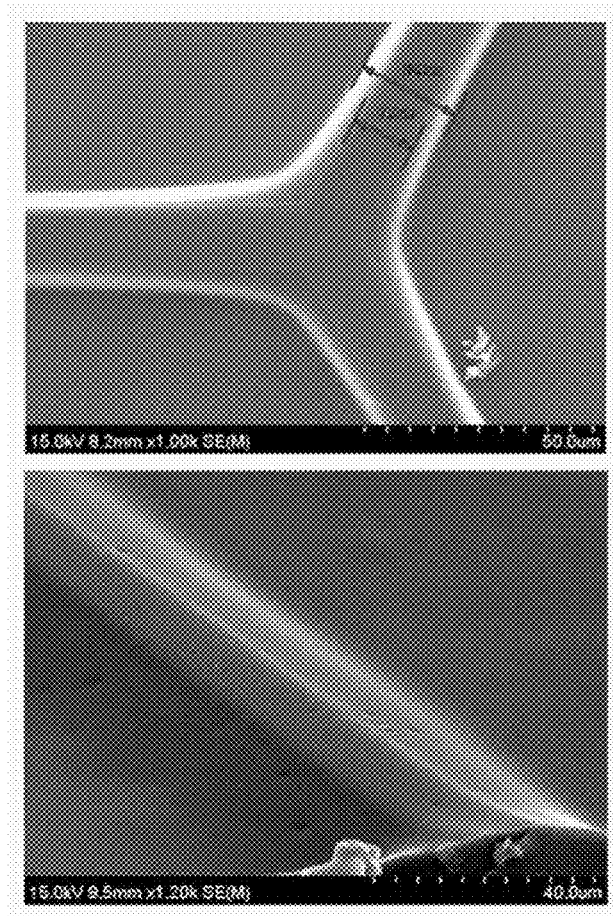

[Figure 6]
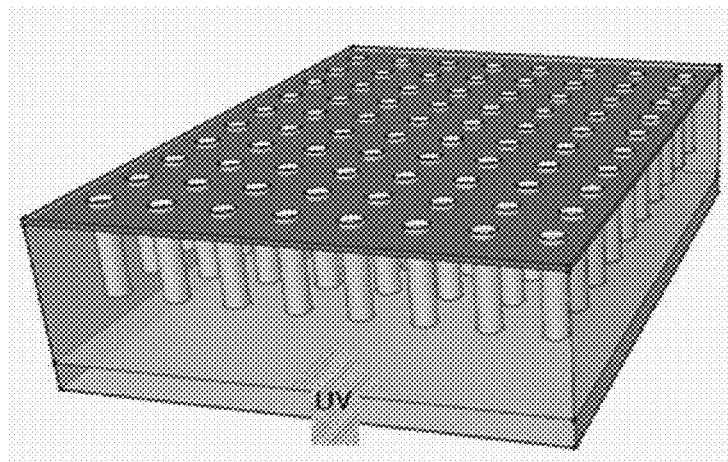
[Figure 7]
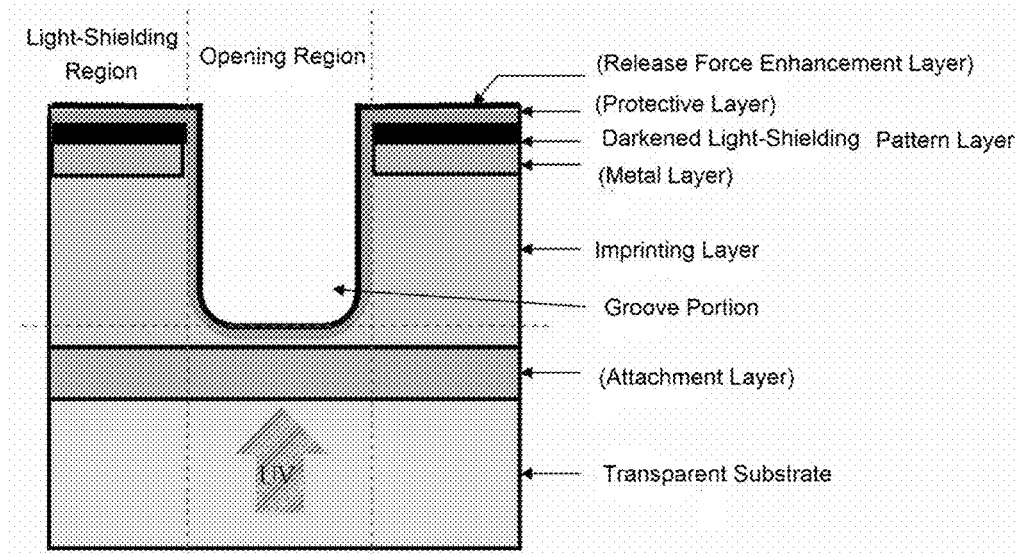

[Figure 8]
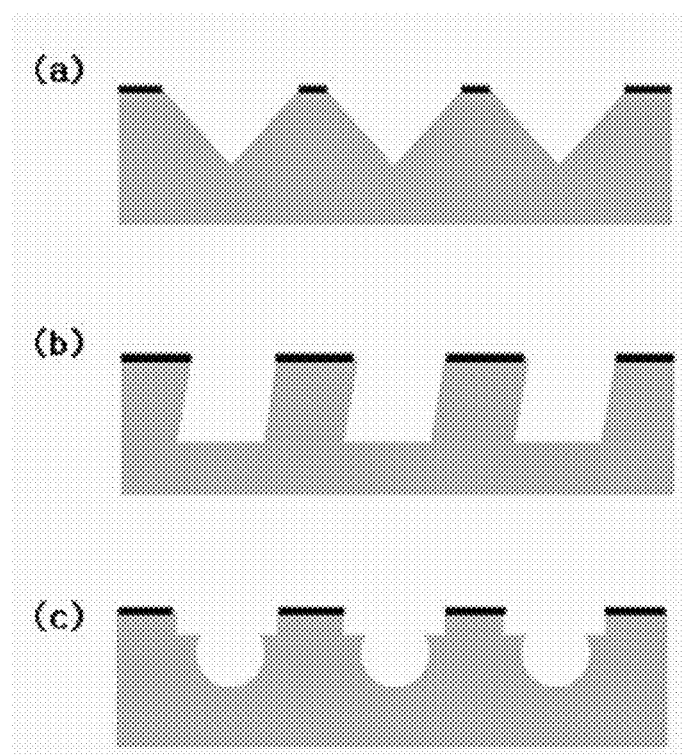

[Figure 9]
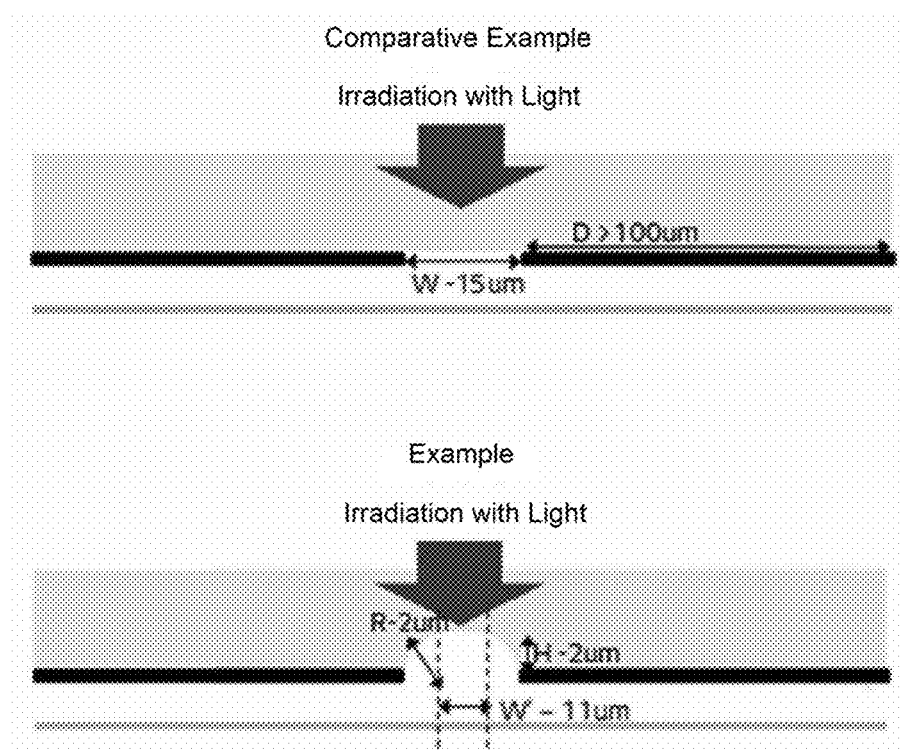

[Figure 10]
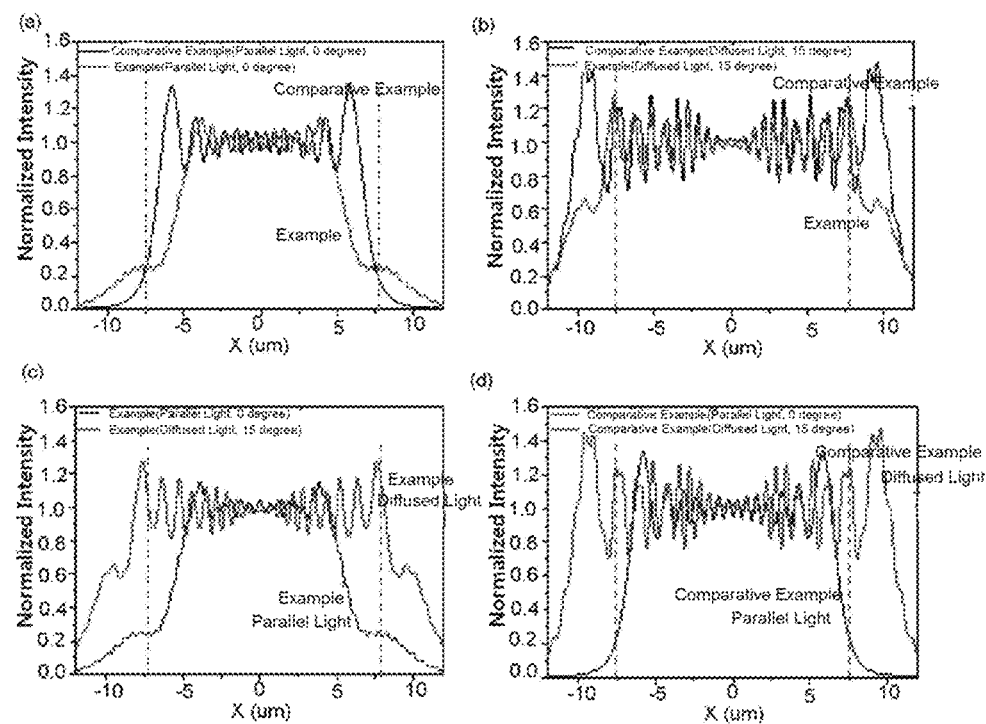

[Figure 11]
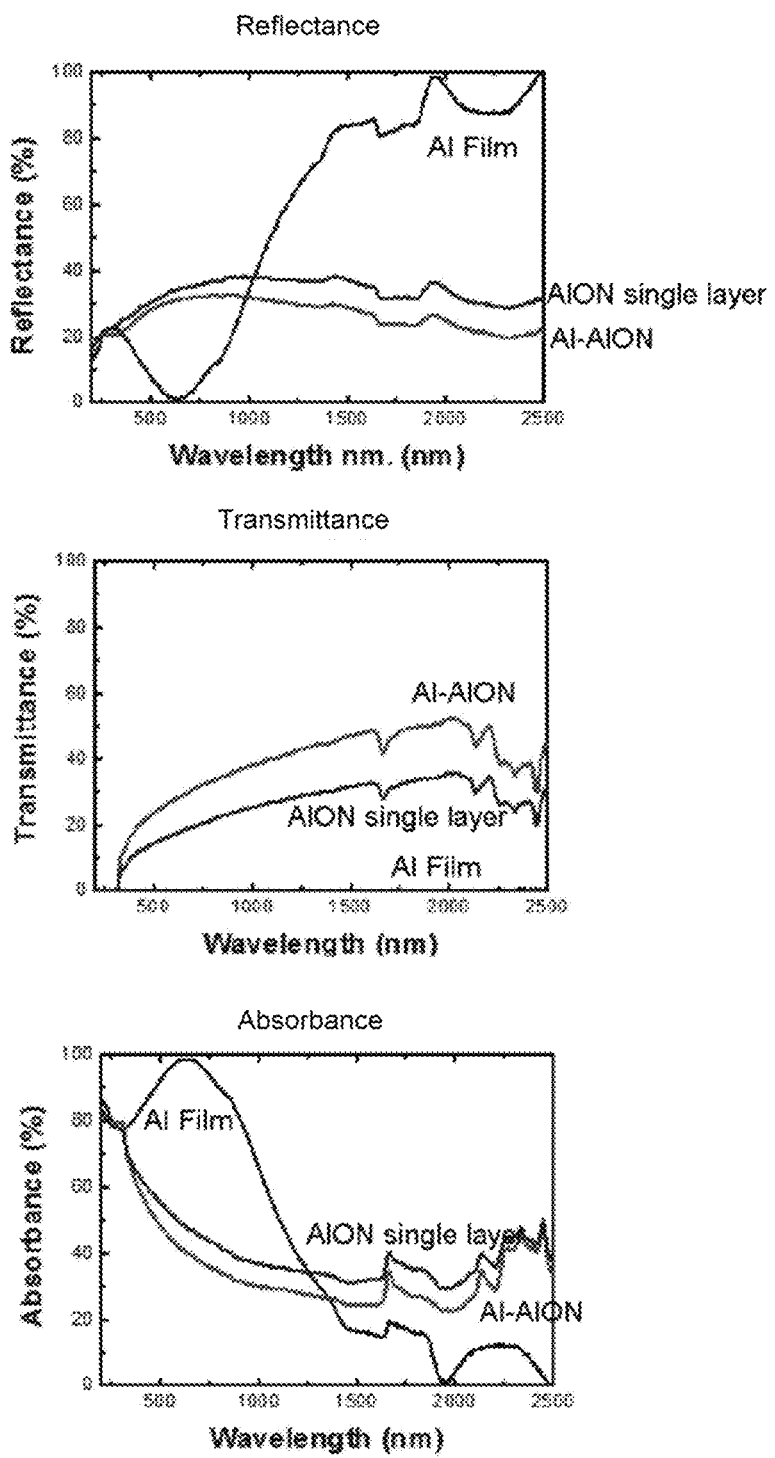

[Figure 12]
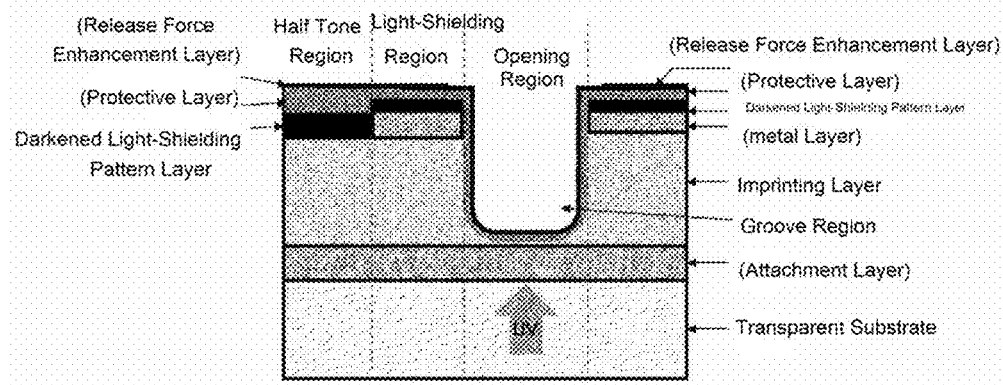
[Figure 13]
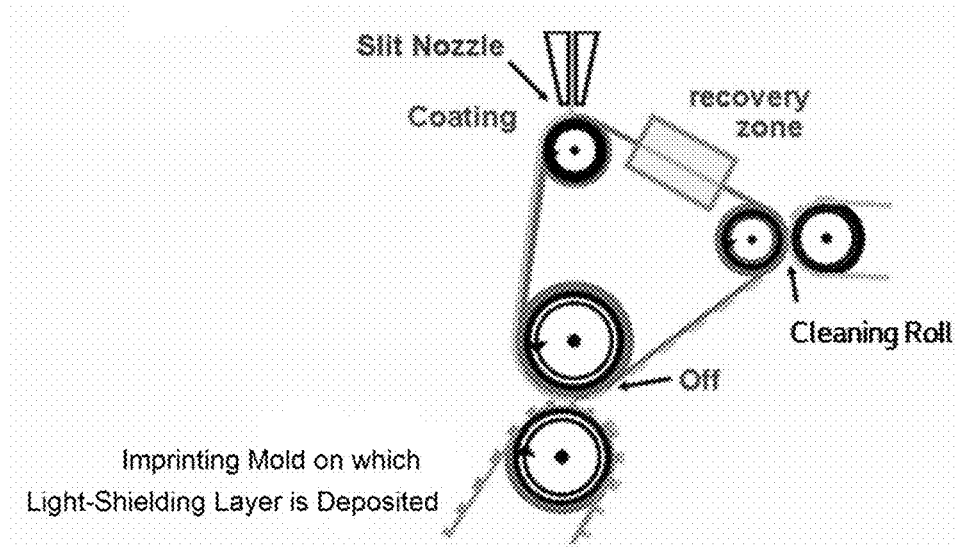

[Figure 14]
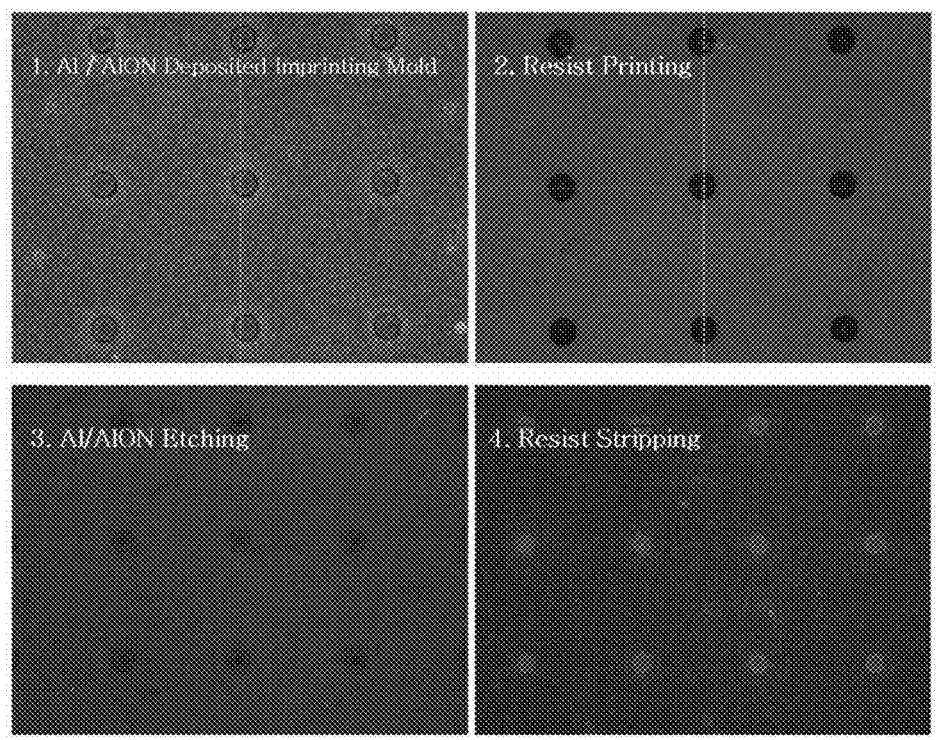

[Figure 15]
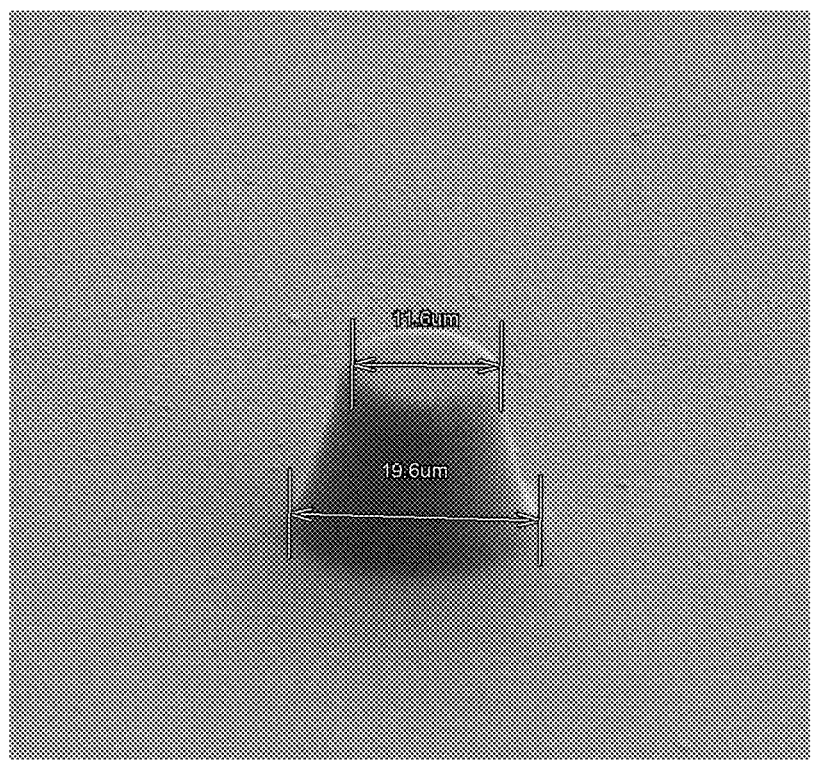

[Figure 16]
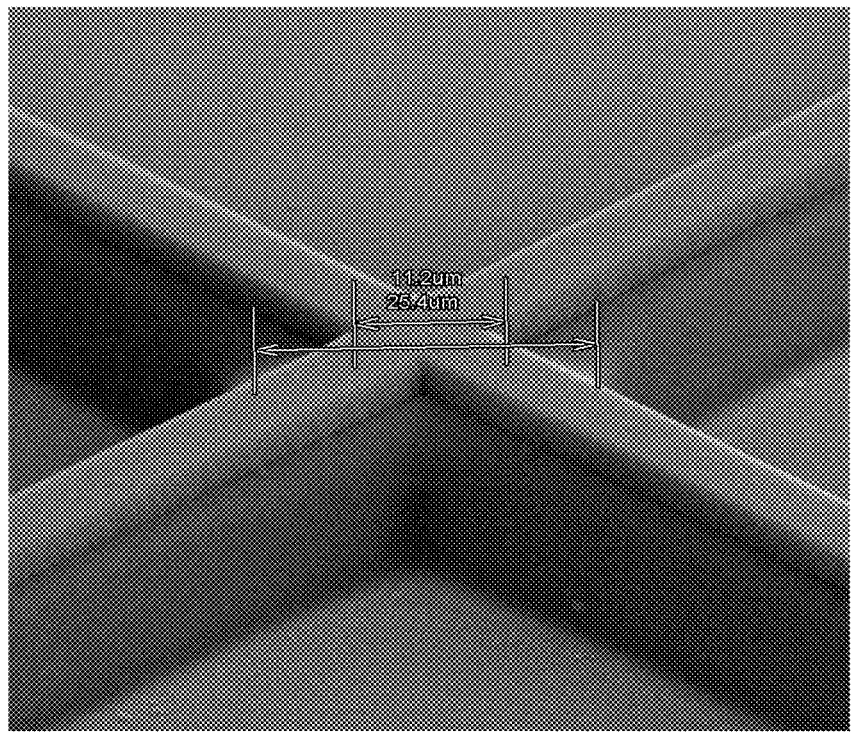
[Figure 17]
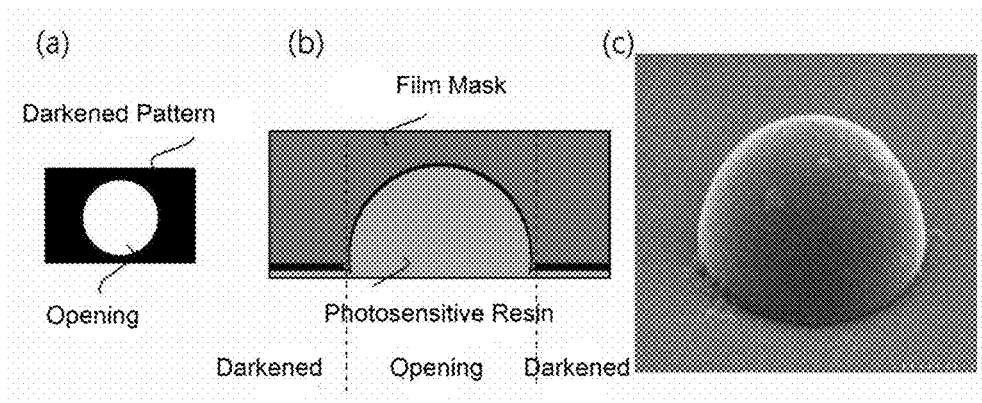

[Figure 18]
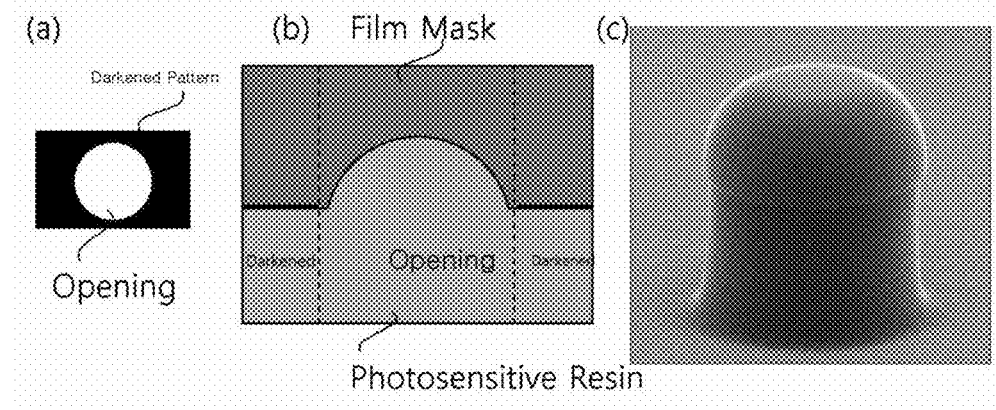
[Figure 19]
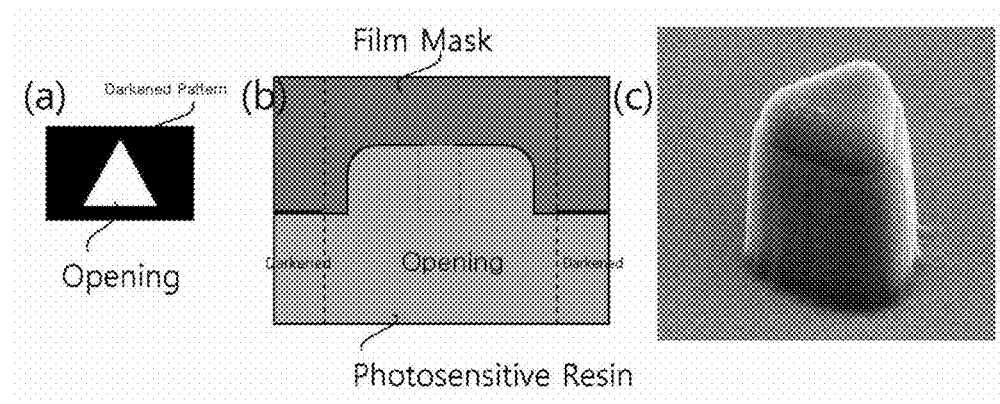

[Figure 20]
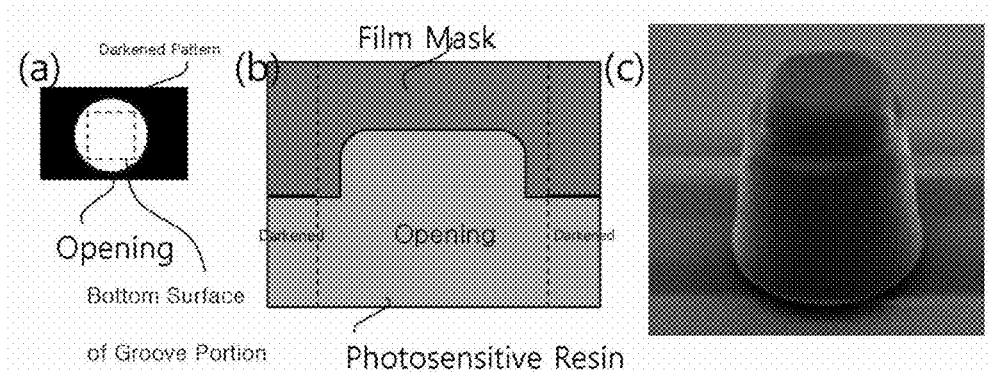

[Figure 21]
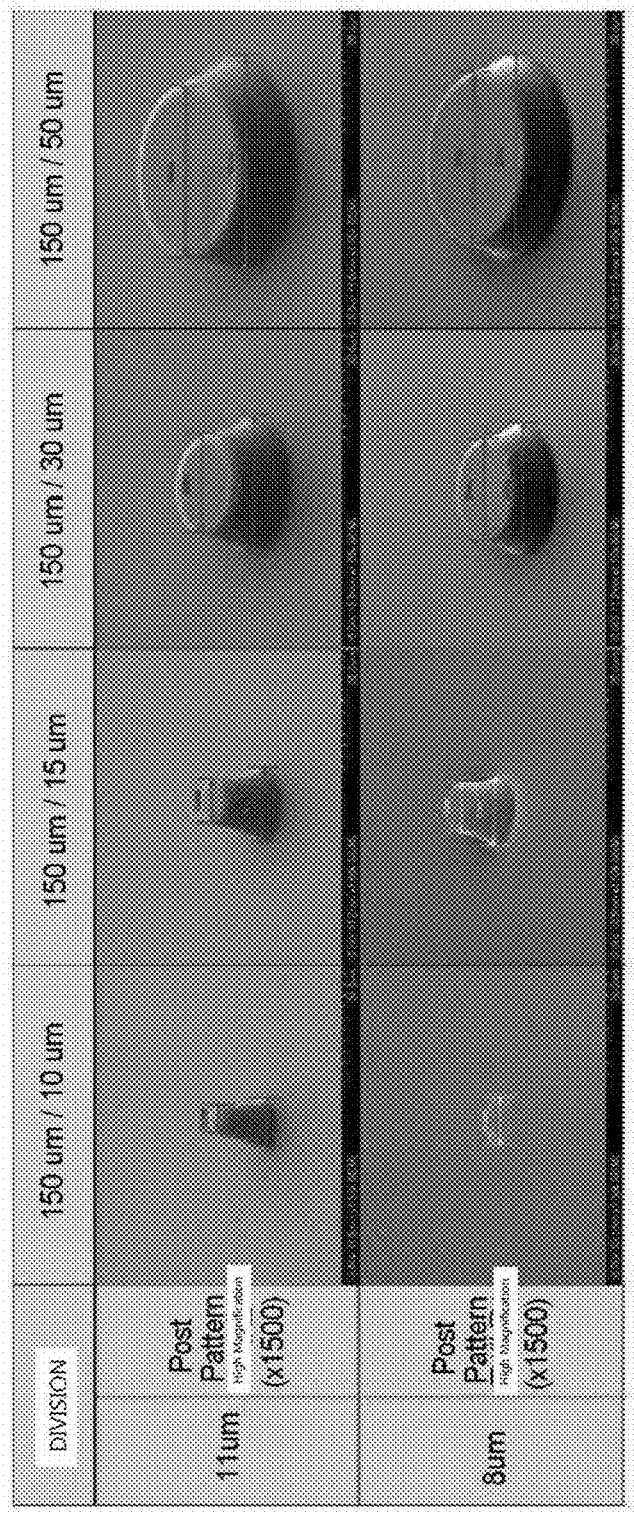

[Figure 22]
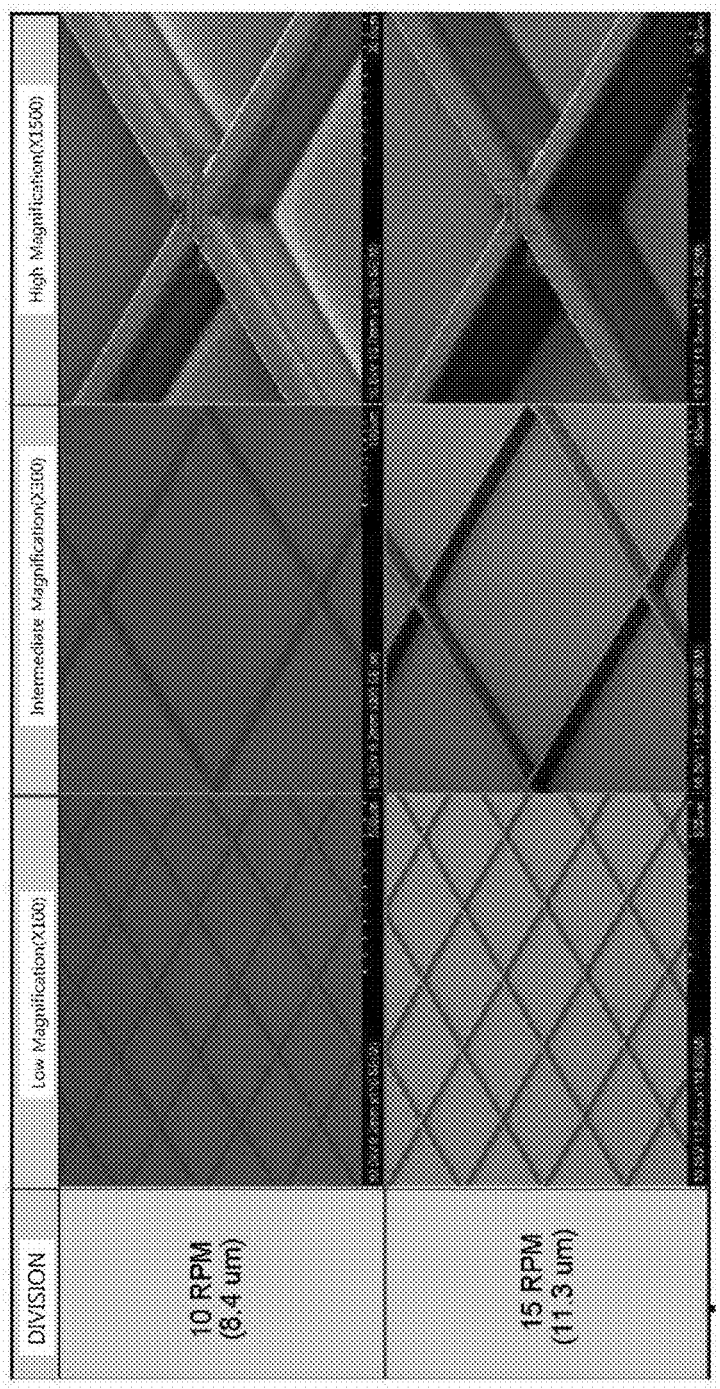

FILM MASK, METHOD FOR MANUFACTURING SAME, AND METHOD FOR FORMING PATTERN USING FILM MASK AND PATTERN FORMED THEREBY

This application is a National Stage Application of International Application No. PCT/KR2017/001033 filed on Jan. 31, 2017, which claims priority to and the benefit of Korean Patent Application No. 10-2016-0010237 filed in the Korean Intellectual Property Office on Jan. 27, 2016, both of which are incorporated herein in their entirety by reference for all purposes as if fully set forth herein.

TECHNICAL FIELD

The present application relates to a film mask, a method for manufacturing the same, and a method for forming a pattern using the film mask and a pattern formed thereby.

BACKGROUND ART

When a general film mask-based roll-to-roll photolithography technology fails to secure adhesive force with a substrate to be patterned, the reduction in resolution of a pattern and the deviation for each position occur. In order to overcome the deviation in patterning for each position, a lamination process is introduced to maximally adhere a film mask in a UV exposed region to a substrate during the pattern process. However, the lamination process has a disadvantage in that it is difficult to maintain an exact tolerance due to characteristics such as a machining tolerance of a nip roll for lamination, generally a tolerance of 3/100 mm or more, and deformation resulting from pressure. In order to overcome the disadvantage, a patterning technology using a dry film resist (hereinafter, referred to as DFR) has been recently attempted, and for the technology, a process comprising warming a dry film resist in a film state at room temperature to near about 100° C., laminating the dry film resist on a substrate, laminating a film mask again, and then performing a UV exposure is carried out. However, the dry film resist has difficulties in implementing a high-resolution pattern due to a disadvantage in that it is difficult to overcome a resolution problem of the DFR during an actual patterning along with a disadvantage in that it is difficult to adjust the thickness of the film to a desired thickness. FIG. 1 illustrates problems with an ability to implement a pattern and an attaching force according to resolution during a patterning by using the DFR. Specifically, there is a problem with the attaching force of an isolated pattern with 15 μm or less when the DFR is used, and there is a problem with an ability to implement a pattern in a region range of 10 μm.

Further, generally, during a roll-to-roll exposure using a film mask, a lamination by means of A Roll and B Roll illustrated in FIG. 2 is introduced, and at this time, the step and uniformity of a patterned photosensitive resin during UV exposure are determined by the uniformity of gap between A Roll and B roll and the straightness of B Roll. At this time, a hard steel roll is typically applied to one of A Roll and B roll, the other roll is determined by characteristics of the resin and other process characteristics, and for example, an RTV Si roll is usually used. At this time, several mechanical defects which may occur during the contact of a roll and a roll are illustrated in FIG. 3. FIG. 3 illustrates an example in which mechanical defects occur when the axes of a rubber roll and a steel roll are brought into contact with each other with being twisted.

In addition, defects illustrated in FIG. 4 may occur according to a material and a shape of a rubber roll. Specifically, unlike an ideal contact shape in FIG. 4(A), as the position at which a load is applied is generally disposed at the edge of the roll, a deformation in which the middle part is lifted occurs as illustrated in FIG. 4(B), or a phenomenon in which the center part becomes thick occurs. In order to solve the problem, there has been conducted an mechanical reinforcement for overcoming the problem by using a crown roll as illustrated in FIG. 4(C) or polishing the edge of the roll. However, although the mechanical reinforcement is conducted, there is a process limitation in which high pressure needs to be applied during the lamination in order to maintain a uniform gap between the film mask and the substrate, which are previously mentioned, and there is a disadvantage in that the thickness of the resin cannot be increased to a desired height for this reason.

Furthermore, it is highly likely that a residual film in a lower region occurs according to whether a deviation between an upper critical dimension (CD) and a lower CD and an exposure amount are adjusted by diffusion characteristics of light during the exposure of a photosensitive resin with a basically formed pattern. The residual film may be particularly more easily generated in the case of a line pattern than in the case of an isolated dot pattern, and the generation of the residual film causes problems such as deterioration in quality of a product and haze. FIG. 5 illustrates a shape of a line pattern and a shape of a residual film which occur when a general roll-to-roll exposure process is applied to a patterning process of a negative-type photosensitive resin composition (an upper portion line width of 14.1 μm, a lower portion line width of 22.9 μm).

CITATION LIST

Patent Document (Patent Document 1) Korean Patent Application Laid-Open No. 1992-0007912

DETAILED DESCRIPTION OF THE INVENTION

Technical Problem

The present application has been made in an effort to provide a film mask which may reduce a residual film phenomenon of a pattern and increase a height step even during a patterning using a liquid photosensitive resin, a method for manufacturing the same, and a method for forming a pattern using the film mask and a pattern formed thereby.

Technical Solution

An exemplary embodiment of the present application provides a film mask comprising:
a transparent substrate;
a darkened light-shielding pattern layer provided on the transparent substrate; and
groove portions provided in a region where the darkened light-shielding pattern layer is not provided.

According to another exemplary embodiment of the present application, the groove portions may also be directly formed on the transparent substrate, and may also be formed in a separate resin layer provided on the transparent substrate. In the present specification, when the groove portions are formed in a separate resin layer formed on the transparent substrate, the resin layer may be mentioned as an imprinting layer.

According to still another exemplary embodiment of the present application, the darkened light-shielding pattern layer is not particularly limited as long as the pattern layer exhibits shielding characteristics in a UV region, and is not particularly limited as long as the darkened light-shielding pattern layer has a reflectance of about 30% or less in the UV region range, for example. According to an exemplary embodiment, the darkened light-shielding pattern layer may be composed of at least one of a black matrix material, a carbon black-based material, a resin mixed with a dye, and AlOxNy ($0 \leq x \leq 1.5$, $0 \leq y \leq 1$, and x and y are a ratio of O atoms and N atoms to one Al atom, respectively).

According to another exemplary embodiment of the present application, the film mask may additionally comprise a metal layer between the transparent substrate or the imprinting layer and the darkened light-shielding pattern layer.

According to still another exemplary embodiment of the present application, a metal layer may be provided between the transparent substrate or the imprinting layer and the darkened light-shielding pattern layer, the film mask may comprise two or more regions of the metal layer where the thicknesses are different from each other or two or more regions of the darkened light-shielding pattern layer where the thicknesses are different from each other, or the film mask may comprise a region where a metal layer is provided between the transparent substrate and the darkened light-shielding pattern layer and a region where the transparent substrate and the darkened light-shielding pattern layer are brought into direct contact with each other.

According to yet another exemplary embodiment of the present application, the film mask may additionally comprise at least one of the darkened light-shielding pattern layer, and a surface protective layer and a release force enhancement layer provided on the groove portion.

According to still yet another exemplary embodiment of the present application, the film mask may further comprise an attachment layer provided between the darkened light-shielding pattern layer and the transparent substrate or the imprinting layer.

According to a further exemplary embodiment of the present application, the film mask may comprise a metal layer provided between the darkened light-shielding pattern layer and the transparent substrate or the imprinting layer, and further comprise an attachment layer between the metal layer and the transparent substrate or the imprinting layer.

Another further exemplary embodiment of the present specification provides a method for manufacturing a film mask, the method comprising:

forming groove portions on a transparent substrate; and forming a darkened light-shielding pattern layer in a region where groove portions are not provided on the transparent substrate.

Still another further exemplary embodiment of the present application provides a method for forming a pattern by using the film mask according to the above-described exemplary embodiments.

Yet another further exemplary embodiment of the present application provides a pattern formed by using the film mask according to the above-described exemplary embodiments.

Still yet another further exemplary embodiment of the present application provides a pattern structure comprising: a substrate; and a pattern provided on the substrate and formed by using a photosensitive resin composition, in which the pattern comprises a boundary portion which divides an upper portion and a lower portion in a thickness direction.

Advantageous Effects

A film mask according to exemplary embodiments described in the present application may reduce a residual film phenomenon and increase a height of a pattern even when a liquid photosensitive resin is patterned. Further, when the film mask according to exemplary embodiments described in the present application is used, a desired pattern may be formed by forming groove portions in a desired form.

BRIEF DESCRIPTION OF DRAWINGS

FIG. 1 is a photograph of a state of a pattern formed by using a DFR method in the related art.

FIG. 2 is a schematic view of an exposure process by means of a roll-to-roll process by using a film mask.

FIG. 3 exemplifies mechanical defects in the roll-to-roll process.

FIG. 4 exemplifies shape defects of a rubber roll.

FIG. 5 is a photograph illustrating a residual film problem when a pattern is formed by using a film mask in the related art.

FIG. 6 is a transmission perspective view of a film mask according to an exemplary embodiment of the present application.

FIG. 7 is a vertical cross-sectional view of the film mask according to an exemplary embodiment of the present application.

FIG. 8 exemplifies various states of vertical cross-sectional views of film masks according to several exemplary embodiments of the present application.

FIGS. 9 and 10 illustrate simulation measurement conditions and results of the film mask according to an exemplary embodiment of the present application and a film mask in the related art.

FIG. 11 illustrates reflectance, transmittance, and absorbance of a material for a darkened light-shielding pattern layer according to an exemplary embodiment of the present application according to the wavelength.

FIG. 12 exemplifies a structure of a film mask comprising a half tone region and manufactured according to an exemplary embodiment of the present application.

FIG. 13 is a schematic view of a manufacturing process of the film mask according to an exemplary embodiment of the present application.

FIG. 14 is a photograph which shows a manufacturing process of a film mask according to Example 2 for each step.

FIGS. 15 to 22 are photographs of patterns formed by using film masks manufactured in Examples 2 to 11.

BEST MODE

A film mask according to an exemplary embodiment of the present application is characterized by comprising: a transparent substrate; a darkened light-shielding pattern layer provided on the transparent substrate; and groove portions provided in a region where the darkened light-shielding pattern layer is provided.

The groove portions may also be directly formed on the transparent substrate, and may also be formed in a separate resin layer provided on the transparent substrate. In the present specification, when the groove portions are formed in a separate resin layer formed on the transparent substrate, the resin layer may be mentioned as an imprinting layer. FIGS. 6 and 7 exemplify a structure in which an imprinting layer is provided on a transparent substrate, and groove portions are formed in the imprinting layer. The film mask of FIG. 7 additionally comprises an attachment layer, a metal layer, a protective layer, and a release force enhancement layer in addition to a darkened light-shielding pattern layer, but some of the layers may be omitted, if necessary.

When a pattern is formed by using a film mask having the structure illustrated in FIGS. 6 and 7, in the case of a negative-type photosensitive resin as an example, since a light-shielding region does not receive light during UV irradiation, the light-shielding region is not cured after UV curing and thus becomes a region where a development is available, and on the contrary, a pattern having a high step may be formed in an opening region where groove portions are formed because a patterning with an additional height is performed according to a depth of the groove portion compared to a coating thickness of the resin. Furthermore, since a form of a pattern may be defined by the shape of the groove portion, there is an advantage in that a stereoscopic form of a finally formed pattern may also be determined.

Since a form of a pattern formed by using the film mask may be determined according to the form of the groove portion, the form and size of the groove portion may be determined according to the form of a pattern to be formed. For example, the width or the diameter of the groove portion may be determined so as to have the same size as an opening portion of the darkened light-shielding pattern layer, and the depth of the groove portion may be determined as 5 nm to 1 mm, for example, 10 nm to 1 µm, but is not limited thereto.

As an example, instead of a pattern which is simply vertically perforated, an inclined pattern or a pattern having a triangular shape, and the like may be implemented, so that it is possible to implement a pattern in which a residual film phenomenon is reduced or the residual film is not present and which has various pattern shapes which are difficult to be implemented through the existing photolithography process.

The groove portion is a portion in which a photosensitive resin to be patterned is imprinted, and a form and a size thereof may be determined in consideration of a form or a size of a pattern to be formed. For example, FIG. 8 exemplifies the forms of several groove portions, but the forms are not limited thereto.

During exposure by using the film mask according to the above-described exemplary embodiments of the present application, a principle in which a high resolution can be implemented while a residual film is minimized was investigated through a simulation. As a result of the simulation, it was confirmed that the film mask according to exemplary embodiments of the present application, which had groove portions between darkened light-shielding pattern layers, had a fewer pattern size extension than the film mask having no groove portions in the related art when diffused light was used, and had a more stable fluctuation in a light source for each position than the film mask having no groove portions in the related art when parallel light was used. Through the confirmation, the cause in which the residual film was minimized when the film mask according to an exemplary embodiment of the present application was used could be assumed.

Furthermore, as a result of confirming a correlation of the shape of the groove portion of the film mask according to the refractive index of the resin used during the simulation, for example, a semi-spherical shape, it was confirmed that when the refractive index of the resin after curing is higher than that of the resin before curing, the relationship of [the mask refractive index<the refractive index of the resin after curing>the refractive index of the uncured resin] was established in a groove region having a semi-spherical shape, which caused light collection effects, and lens effect could occur due to the light collection effects. The refractive index of the mask is a refractive index of a layer in which groove portions are formed, for example, a transparent substrate or an imprinting layer.

In an exemplary embodiment, it is preferred that the darkened light-shielding pattern layer exhibits shielding characteristics in the UV region, and for the darkened light-shielding pattern layer, it is possible to use, for example, a material having a reflectance of about 30% or less in the UV region range. According to an exemplary embodiment, the darkened light-shielding pattern layer may be composed of at least one of a black matrix material, a carbon black-based material, a resin mixed with a dye, and $AlO_xN_y$ ($0 \leq x \leq 1.5$, $0 \leq y \leq 1$, and x and y are a ratio of O atoms and N atoms to one Al atom, respectively). The range of x and y is preferably x>0, or y>0, or x>0 and y>0.

When the darkened light-shielding pattern layer is composed of $AlO_xN_y$, it is preferred that $0 \leq x \leq 1.5$ or $0 \leq y \leq 1$. When aluminum oxide, aluminum nitride, or aluminum oxynitride is used as the darkened light-shielding pattern layer, the darkened light-shielding pattern layer may alone exhibit semi-permeable characteristics and anti-reflection characteristics for the UV wavelength, so that according to the thickness of the darkened light-shielding pattern layer based on the characteristics, or by introducing a stacking structure with a metal layer based on these characteristics, the darkened light-shielding pattern layer may be applied to the manufacture of a half tone mask used for the purpose of multilayer patterning.

The material and thickness of the darkened light-shielding pattern layer may be determined according to a size or a form of a material and a pattern to be patterned by using a film mask, and particularly, the thickness thereof may be determined according to the required UV light transmittance. For example, the darkened light-shielding pattern layer may have a thickness of 5 nm to 200 nm, and the thickness of the darkened light-shielding pattern layer is not limited as long as the thickness of the darkened light-shielding pattern layer is enough to shield light.

The darkened light-shielding pattern layer may have a pattern form having a form of a pattern to be implemented by UV exposure as an opening region. For example, when a pattern with a cylindrical form or a dot form is intended to be formed, the darkened light-shielding pattern layer may have a pattern having circular openings. When the darkened light-shielding pattern layer is formed of the above-described $AlO_xN_y$, the size of the opening is easily formed with a desired size, and the darkened light-shielding pattern layer may have, for example, a circular opening having a diameter of 1 to 30 µm, or a linear opening having a line width of 1 to 30 µm.

In particular, when the darkened light-shielding pattern layer is formed of the above-described $AlO_xN_y$, a high-resolution pattern with 15 µm or less may be formed, and a scan mura problem caused by the exposure method may be minimized.

In order to implement the pattern of the darkened light-shielding pattern layer, it is possible to apply various methods utilizing photolithography in addition to a direct exposure process using laser, which is typically used, or using a printing technique such as offset and inkjet. For example, the present inventors measured reflection and absorption wavelengths for the UV region (100 nm to 400 nm) with respect to a single layer and a stacking (AlOxNy/Al) structure of each of an Al layer and an Al-based oxynitride, and as a result, the present inventors confirmed that the stacking structure had a reflectance of about 30% or less for the UV region range, and that the stacking structure could be used on the whole as a material for a mask by absorbing the other light (FIG. 11). In other words, the AlOxNy layer alone exhibits semi-permeable characteristics and anti-reflection characteristics for the UV wavelength, so that the present inventors confirmed that the AlOxNy layer could serve as an anti-reflection film in a mask structure in the related art.

The transparent substrate is not particularly limited as long as the transparent substrate has a light transmittance enough for an exposure process to be carried out by using the above-described film mask. The transparent substrate may be determined according to the size or material of a pattern to be patterned by using a film mask, and for example, it is preferred that a transparent substrate having a visible light transmittance of 50% or more is used. In order to use a roll when a pattern is formed by using a film mask, it is preferred that as the transparent substrate, a flexible substrate is used, and for example, a plastic film, specifically, a polyethylene terephthalate (PET) film may be used. The thickness of the transparent substrate is sufficient as long as the thickness may support a film mask, and is not particularly limited. For example, the transparent substrate may have a thickness of 10 nm to 1 mm, specifically, 10 μm to 500 μm.

When a resin layer in which the groove portions are formed, that is, an imprinting layer is provided, the imprinting layer may be formed of a resin known in the art, and the imprinting layer may also be the same material as that for the transparent substrate, and may also be a material different from that for the transparent substrate. Preferably, the imprinting layer may be formed of a photosensitive resin.

An exemplary embodiment may additionally comprise a metal layer between the transparent substrate and the darkened light-shielding pattern layer.

The metal layer may compensate light-shielding properties of the darkened light-shielding pattern layer, and may facilitate the formation or patterning of the darkened light-shielding pattern layer. For the metal layer, a material capable of compensating light-shielding properties, or a material which easily forms the darkened light-shielding pattern layer may be used. For example, aluminum (Al) may be used, and in this case, a darkened light-shielding pattern layer composed of aluminum oxide, aluminum nitride, or aluminum oxynitride is easily formed thereon. Further, it is easy for aluminum to be patterned simultaneously with a darkened light-shielding pattern layer composed of aluminum oxide, aluminum nitride, or aluminum oxynitride. The thickness of the metal layer may be determined in consideration of light-shielding properties, processability, or flexibility, and may be determined within, for example, 1 nm to 10 μm.

According to another exemplary embodiment of the present application, depending on durability, attaching characteristics, and the like of a material which serves to shield light in a film mask, an attachment layer may be additionally provided at the lower portion of the darkened light-shielding pattern layer, or a surface protective layer and/or a release force enhancement layer may be additionally introduced on the darkened light-shielding pattern layer.

The attachment layer may be provided between the darkened light-shielding pattern layer and the transparent substrate or the imprinting layer. Further, the attachment layer may be provided between the metal layer and the transparent substrate or the imprinting layer. As the attachment layer, it is possible to use an attachment layer which does not negatively affect a patterning using a film mask while reinforcing the attaching force between the transparent substrate or the imprinting layer and the darkened light-shielding pattern layer or the metal layer. For example, an attachment layer material such as an acrylic, epoxy-based or urethane-based material may be used.

In the case of the surface protective layer, a urethane acrylate-based surface protective layer may be introduced as an example, but in the case of hardness at the HB level or higher, it was also confirmed that the material for the surface protective layer was not particularly limited. However, when a residual film and an increase in resolution of a product through a film mask, and the like are considered, it is preferred that a layer which has a larger refractive index than that of a substrate or an attachment layer and does not absorb UV light is used as a surface protective layer, if possible.

Thereafter, in the case of a release force enhancement layer corresponding to an outermost layer, it was confirmed that a layer in a form comprising a fluorine-based material, a silicone-based material, or a mixture thereof could be introduced, and when the layer was introduced, a layer having a thickness of 100 nm or less was preferred. For example, the release force enhancement layer may be formed to have a thickness of 1 nm to 100 nm. Examples of a method for forming the corresponding layer comprise a wet coating method and a vapor deposition method, and the vapor deposition method is more advantageous. Furthermore, according to the process by a user, a film mask manufactured for the purpose of increasing a thickness may be reinforced and used through an additional substrate and an additional bonding layer. The release force enhancement layer is effective for general releasing processes and molding processes when the release force enhancement layer has surface energy, for example, 30 dynes/cm or less which is equal to or less than that of a substrate to be patterned, for example, a plastic film such PET, an ITO film, and the like. As the release force enhancement layer, a release force enhancement layer having surface energy of preferably 22 dynes/cm or less, and more preferably 15 dynes/cm or less may exhibit a good performance. The lower the surface energy of the release force enhancement layer is, the better the release force enhancement layer is, and the surface energy may be more than 0 dynes/cm and 30 dynes/cm or less.

A material for the release force enhancement layer is not particularly limited as long as the material has the surface energy, and a fluorine-based material, a silicone-based material, or a mixture thereof may be used. As a specific example, it is possible to use a fluorine-based material having a perfluoroether chain, a silicone-based material having an alkoxy silane or silanol, or a mixture thereof. The silicone-based material such as the alkoxy silane or silanol may improve attaching properties to other substrates. Additionally, the release force enhancement layer may additionally comprise a $SiO_2$ layer or a $TiO_2$ layer in order to reinforce the durability of the release force enhancement layer. For example, when a $SiO_2$ layer or a $TiO_2$ layer is first deposited, and then a layer comprising a silanol is formed, —OH of the silanol is subjected to a dehydration condensation reaction at room temperature, and thus may induce the layer comprising the silanol to be completely bonded to a surface of a layer which is brought into contact with the layer comprising the silanol.

According to still another exemplary embodiment of the present application, a metal layer is provided between the transparent substrate and the darkened light-shielding pattern layer, the film mask comprises two or more regions of the metal layer where the thicknesses are different from each other or two or more regions of the darkened light-shielding pattern layer where the thicknesses are different from each other, or the film mask comprises a region where a metal layer is provided between the transparent substrate and the darkened light-shielding pattern layer and a region where the transparent substrate and the darkened light-shielding pattern layer are brought into direct contact with each other. FIG. 12 exemplifies a structure of a film mask comprising a region which is provided with a metal layer and a region which is not provided with a metal layer. Depending on the thickness of a metal layer or a darkened light-shielding pattern layer or the presence or absence of a metal layer, a portion having a different light transmittance is created in a film mask, thereby manufacturing a half tone region. In FIG. 12, a thickness of a pattern formed by a half tone region, in which a darkened light-shielding pattern layer which transmits only a portion of the UV light is present, is formed to be thinner than the thickness of a pattern formed by a general mask region which does not have a darkened light-shielding pattern and a metal layer.

Yet another exemplary embodiment of the present specification provides a method for manufacturing a film mask, the method comprising:

forming groove portions in a transparent substrate; and forming a darkened light-shielding pattern layer in a region where groove portions is not provided in the transparent substrate.

As a specific example, the method for manufacturing a film mask may comprise:

coating a resin for forming groove portions in a transparent substrate;

forming groove portions by imprinting the resin for forming groove portions by using a master mold and exposing the resin for forming a groove portion; and forming a darkened light-shielding pattern layer in a region where the groove portions are not provided.

The manufacturing method may further comprise performing an inspection and a repair, if necessary.

The forming of the darkened light-shielding pattern layer in a region other than the region where the groove portions are formed may also be implemented through any technology as long as the technology may selectively form a pattern on an irregular portion.

According to an example, a darkened light-shielding pattern layer may also be formed by directly transferring a material for a darkened light-shielding pattern layer, such as an ink comprising a dye or a pigment capable of shielding the wavelength in the UV region range, into a region other than the region where the groove portions are formed.

According to another example, a darkened light-shielding pattern layer may also be formed by using a reverse offset printing technology. A layer, that is, a darkened light-shielding pattern layer is formed on a surface of a transparent substrate provided with groove portions by using a material for forming a darkened light-shielding pattern layer. According to an example, an AlOxNy layer or an Al layer/an AlOxNy layer as the darkened light-shielding pattern layer may be formed by a deposition method. Subsequently, a resist pattern may be formed in a region where groove portions are not provided as illustrated in FIG. 13 by using a transparent substrate, in which the darkened light-shielding pattern layer is formed, as a role of a cliché which performs an off process in the reverse offset printing technology. According to FIG. 13, a portion of a photoresist may be made to be off with a surface of an imprinting mold in which groove portions are not provided by coating the photoresist using a slit nozzle, and then bringing the photoresist into contact with the imprinting mold on which a light-shielding layer is deposited, and a continuous process may be carried out by washing the other photoresist which is not off through a cleaning roll.

Still yet another exemplary embodiment of the present application provides a method for forming a pattern by using the film mask according to the above-described exemplary embodiments. The method may comprise: applying a photosensitive resin composition onto a substrate; exposing the applied photosensitive resin composition through a film mask; and developing the photosensitive resin composition. The process may be performed through a roll-to-roll process. The roll-to-roll process may be carried out by the method illustrated in FIG. 2. During the exposure, the surface of the film mask in which the groove portions are provided is disposed close to the photosensitive resin composition.

A further exemplary embodiment of the present application provides a pattern formed by using the film mask according to the above-described exemplary embodiments.

Another further exemplary embodiment of the present application provides a pattern structure comprising: a substrate; and a pattern provided on the substrate and formed by using a photosensitive resin composition, in which the pattern comprises a boundary portion which divides an upper portion and a lower portion in a thickness direction. As the boundary portion, two regions divided by the boundary portion may be divided by surface characteristics, a form, and the like on a surface of a pattern composed of one layer, and the materials for the two regions are not different from each other, or the two regions are not divided into a separate layer. For example, the boundary portion may be expressed as a line or a structure which traverses a circumference of the pattern at the same height from the substrate in which the pattern is formed. The structure which traverses the circumference of the pattern at the same height from the substrate may also be expressed as a groove portion, and may also be expressed as a structure in which the slope of the surface is rapidly changed in a thickness direction of the pattern, for example, a structure in which the slope becomes gentle.

The boundary portion as described above divides a region from the largest depth of the groove portion of the film mask according to the above-described exemplary embodiments to the depth of (the largest depth of the groove portion—the thickness of the darkened light-shielding pattern layer) and a region from the largest depth of the groove portion of the film mask according to the above-described exemplary embodiments to the depth of the thickness of the darkened light-shielding pattern layer of the groove portion. Here, when a region which is relatively far away from a substrate and a region which is relatively close to the substrate are defined as an upper portion and a lower portion, respectively, in the two regions divided by the boundary portion in the formed pattern, the upper portion of the pattern corresponds to a region from the largest depth of the groove portion of the film mask to the depth of (the largest depth of the groove portion—the thickness of the darkened light-shielding pattern layer), and the lower portion of the pattern corresponds to a region from the largest depth of the groove portion of the film mask to the depth of the thickness of the darkened light-shielding pattern layer of the groove portion.

According to an exemplary embodiment, the upper portion and the lower portion of the pattern divided by the boundary portion may have different surface roughnesses. For example, the surface roughness of the upper portion of the pattern may be smaller or more regular than that of the lower portion of the pattern. The upper portion of the pattern is cured by an exposure in a state where the upper portion of the pattern is imprinted by the groove portions of the film mask, and thus may have surface characteristics corresponding to characteristics of the internal surface of the groove portion of the film mask. In contrast, the lower portion of the pattern is a portion which is not exposed by the darkened light-shielding pattern layer, and thus may exhibit a surface roughness which does not correspond to characteristics of the internal surface of the groove portion of the film mask and is relatively a little larger or more irregular.

According to an exemplary embodiment, the height of the pattern is uniform. When the film mask according to the above-described exemplary embodiment is used, the height of the pattern may be uniformly set because the size and the form of the pattern may be determined according to the form of the groove portion.

[Mode for Invention]

Hereinafter, the present invention will be described in more detail through Examples. However, the following Examples are only for exemplifying the present invention, and are not intended to limit the present invention.

EXAMPLE 1 AND COMPARATIVE EXAMPLE 1

As illustrated in FIG. 9, in Comparative Example 1, a darkened light-shielding pattern layer having an opening having a diameter of 15 μm and formed of chromium was formed on a transparent substrate, and in Example 1, groove portions (a height of 2 μm, a lower surface diameter of 15 μm, a lower surface diameter of 11 μm, and a radius of 2 μm) were formed at a portion corresponding to the opening of the darkened light-shielding pattern layer in Comparative Example 1. At this time, the width of the chromium layer of the darkened light-shielding pattern layer was more than 100 μm. FIG. 10 illustrates a result of measuring an intensity (normalized intensity) according to x (distance from the opening center of the darkened light-shielding pattern layer, and the distance between the two dotted lines in FIG. 10 is a position in which an imprinting pattern is formed) when the pattern as described above was irradiated with parallel light or diffused light (λ=365 nm). FIG. 10(A) compares the intensities of the structures in Comparative Example 1 and Example 1 during the irradiation with parallel light, and FIG. 10(B) compares the intensities of the structures in Comparative Example 1 and Example 1 during the irradiation with diffused light. It could be confirmed that the intensity was high in a region corresponding to the actual opening diameter (15 μm) in Example 1 as compared to Comparative Example 1, whereas the intensity was high even in a region larger than the actual opening diameter in Comparative Example 1. Accordingly, it can be seen that the pattern precision may be higher in Example 1 than in Comparative Example 1. In particular, when diffused light is used, it is possible to prevent the pattern size from being increased in Example 1 as compared to Comparative Example 1. Further, it could be confirmed that a fluctuation in a light source for each position was more stable when parallel light was used than when diffused light was used.

EXAMPLE 2

An attachment layer was formed on a PET substrate having a thickness of 250 μm by using a urethane-based material, a photosensitive resin layer (a UV-curable urethane acrylic resin) was coated thereon, and then groove portions in the form of a cylinder having a diameter of a bottom surface of 11.6 μm and a depth of 5 μm was formed by an imprint method. Subsequently, an Al layer having a thickness of 100 nm was formed by a sputtering method. An AlOxNy layer (x>0 and 0.3≤y≤1) was formed by means of reactive sputtering by adding nitrogen, which is a reactive gas, onto the Al layer (1 of FIG. 14). Next, a photoresist layer was formed in a region other than the region where the groove portions were formed by using the method illustrated in FIG. 13 (2 of FIG. 14), and then the metal layer and the AlOxNy layer formed at the groove portions were removed by using an etchant (3 of FIG. 14). Next, the photoresist layer was stripped (4 of FIG. 14). Next, a urethane acrylate-based surface protective layer was coated and formed thereon, and an Si-based release force enhancement layer was formed. FIG. 14 illustrates a photograph illustrating a surface of a transparent substrate after an Al/AlON layer is deposited, a photograph illustrating a surface in which a photoresist is printed in a region other than the region where groove portions are formed, a photograph in which Al/AlON in the groove portions are etched, and a photograph in which the photoresist is removed.

FIG. 15 illustrates a photograph of a pattern obtained by patterning a photosensitive urethane acrylic UV resin by using the method illustrated in FIG. 2 by using the film mask thus manufactured (×1,500). An upper diameter and a lower diameter of the obtained pattern were 11.6 μm and 19.6 μm, respectively.

As illustrated in FIG. 15, it can be confirmed that the shape of the groove portion is transferred to the upper portion of the obtained pattern as it is. Accordingly, the upper portion of the pattern had a regular shape, whereas the lower portion thereof exhibited a form in which a width of an increase in thickness gradually becomes relatively larger. Further, it could be confirmed that residual film defects were significantly reduced as compared to FIG. 5. In addition, it could be confirmed that the height of the pattern was increased by the thickness of the groove portion of the film mask.

EXAMPLE 3

An experiment was performed in the same manner as in Example 2, except that the opening and the groove portion of the darkened light-shielding pattern layer were linear. FIG. 16 illustrates a photograph of the obtained pattern. The line width of the upper portion of the intersection portion of the linear pattern was 11.2 μm, and the line width of the lower portion of the intersection portion was 25.4 μm.

EXAMPLE 4

An experiment was performed in the same manner as in Example 2, except that the opening of the darkened light-shielding pattern layer was circular as illustrated in FIG. 17(A) and the groove portions were formed as a lens structure as illustrated in FIG. 17(B). During the formation of the pattern, the film mask was closely adhered to a bottom surface of a substrate on which a photosensitive resin composition to be patterned had been coated, and then was UV-cured. FIG. 17(C) illustrates the obtained pattern.

EXAMPLE 5

An experiment was performed in the same manner as in Example 2, except that the opening of the darkened light-shielding pattern layer was circular as illustrated in FIG. 18(A) and the groove portions were formed as a lens structure as illustrated in FIG. 18(B). During the formation of the pattern, only a portion of a thickness of the substrate on which a photosensitive resin composition to be patterned was coated was brought into contact with the groove portion, and then was UV-cured. FIG. 18(C) illustrates the obtained pattern.

EXAMPLE 6

An experiment was performed in the same manner as in Example 2, except that the opening of the darkened light-shielding pattern layer was triangular as illustrated in FIG. 19(A) and the groove portions were formed as a trigonal prismatic structure as illustrated in FIG. 19(B). During the formation of the pattern, only a portion of a thickness of the substrate on which a photosensitive resin composition to be patterned was coated was brought into contact with the groove portion, and then was UV-cured. FIG. 19(C) illustrates the obtained pattern.

EXAMPLE 7

An experiment was performed in the same manner as in Example 2, except that the opening of the darkened light-shielding pattern layer was circular as illustrated in FIG. 20(A) and the groove portions were formed as a square pillar structure as illustrated in FIG. 20(B). During the formation of the pattern, only a portion of a thickness of the substrate on which a photosensitive resin composition to be patterned was coated was brought into contact with the groove portion, and then was UV-cured. FIG. 20(C) illustrates the obtained pattern.

EXAMPLE 8

An experiment was performed in the same manner as in Example 2, except that the pitches of the opening and the groove portion of the darkened light-shielding pattern layer were 150 μm, the diameters thereof were 10 μm, 15 μm, 30 μm, and 50 μm, and the height of the manufactured pattern was 11 μm. FIG. 21 illustrates a photograph (×1,500) of a pattern manufactured by using the thus manufactured film mask.

EXAMPLE 9

An experiment was performed in the same manner as in Example 2, except that the pitches of the opening and the groove portion of the darkened light-shielding pattern layer were 150 μm, the diameters thereof were 10 μm, 15 μm, 30 μm, and 50 μm, and the height of the manufactured pattern was 8 μm. The height of the pattern was adjusted by using the process speed. When the process speed is slowed down, the height becomes low. FIG. 21 illustrates a photograph (×1,500) of a pattern manufactured by using the thus manufactured film mask.

EXAMPLE 10

An experiment was performed in the same manner as in Example 9, except that the line widths of the opening and the groove portion of the darkened light-shielding pattern layer were linear. At this time, during the formation of the pattern, the process speed was 10 RPM, and the height of the pattern was 8.4 μm. FIG. 22 illustrates photographs of the manufactured pattern obtained at a low magnification (×110), an intermediate magnification (×300), and a high magnification (×1,500).

EXAMPLE 11

An experiment was performed in the same manner as in Example 9, except that the line widths of the opening and the groove portion of the darkened light-shielding pattern layer were linear. At this time, during the formation of the pattern, the process speed was 15 RPM, and the height of the pattern was 11.3 μm. FIG. 22 illustrates photographs of the manufactured pattern obtained at a low magnification (×110), an intermediate magnification (×300), and a high magnification (×1,500).

The invention claimed is:

1. A film mask, comprising:
   a transparent substrate;
   a separate resin layer provided on the transparent substrate;
   a light-shielding region that includes:
      an aluminum metal layer provided on the resin layer; and
      a darkened light-shielding pattern layer provided on the aluminum metal layer, the aluminum metal layer provided between the transparent substrate and the darkened light-shielding pattern layer;
   a half tone region provided on the resin layer and that includes the darkened light-shielding pattern layer having a thickness that is different from a thickness of the darkened light-shielding pattern layer in the light-shielding region; and
   groove portions formed in the separate resin layer provided in a region where no darkened light-shielding pattern layer is provided,
   wherein the darkened light-shielding pattern layer comprises AlOxNy (0≤x≤1.5, 0≤y≤1, and x and y are a ratio of O atoms and N atoms to one Al atom, respectively).

2. The film mask of claim 1, wherein the darkened light-shielding pattern layer has a reflectance of about 30% or less of light in a UV region range.

3. The film mask of claim 1, further comprising:
   at least one of a surface protective layer and a release force enhancement layer provided on the darkened light-shielding pattern layer and the groove portion.

4. The film mask of claim 1, further comprising:
   an attachment layer provided between the darkened light-shielding pattern layer and the transparent substrate.

5. The film mask of claim 1, further comprising an attachment layer provided between the aluminum metal layer and the transparent substrate.

6. The film mask of claim 1, wherein the substrate is a flexible plastic.

7. The film mask of claim 1, wherein the substrate is a polyethylene terephthalate (PET) film.

8. A method for manufacturing the film mask according to claim 1, the method comprising:
   coating the separate resin layer on the transparent substrate;
   forming groove portions in the separate resin layer;
   forming the light-shielding region by:
      providing the aluminum metal layer of a region where the groove portions are not provided; and
      forming the darkened light-shielding pattern layer on the aluminum metal layer; and
   forming the half tone region by providing on the resin layer the darkened light-shielding pattern layer having a thickness that is different from the thickness of the darkened light-shielding pattern layer in the light-shielding region, wherein the darkened light-shielding pattern layer comprises AlOxNy (0≤x≤1.5, 0≤y≤1, and x and y are a ratio of O atoms and N atoms to one Al atom, respectively).

9. The method of claim 8, wherein the forming of the groove portions comprises:

imprinting the separate resin using a master mold; and exposing the separate resin to UV light for forming a groove portion.

10. A method for forming a pattern, comprising:

applying a photosensitive resin composition onto a substrate;

exposing the applied photosensitive resin composition to light through the film mask of claim 1; and developing the photosensitive resin composition.

11. The method of claim 10, wherein the photosensitive resin composition is selected that satisfies a relationship of [a refractive index of a mask<a refractive index of the photosensitive resin composition after curing>a refractive index of an uncured photosensitive resin composition].

\* \* \* \* \*